United States Patent
Fink et al.

(10) Patent No.: US 7,466,753 B2
(45) Date of Patent: Dec. 16, 2008

(54) MICROCONTROLLER HAVING A DIGITAL TO FREQUENCY CONVERTER AND/OR A PULSE FREQUENCY MODULATOR

(75) Inventors: Scott Raymond Fink, Apache Junction, AZ (US); Johannes Albertus van Niekerk, Tempe, AZ (US); Joseph Harry Julicher, Chandler, AZ (US)

(73) Assignee: Microchip Technology Incorporated, Chandler, AZ (US)

( * ) Notice: Subject to any disclaimer, the term of this patent is extended or adjusted under 35 U.S.C. 154(b) by 866 days.

(21) Appl. No.: 11/000,777

(22) Filed: Dec. 1, 2004

(65) Prior Publication Data

US 2006/0114983 A1    Jun. 1, 2006

(51) Int. Cl.
*H03K 7/06* (2006.01)
*H04L 7/06* (2006.01)
*H04J 3/06* (2006.01)

(52) U.S. Cl. .................. 375/239; 375/364; 370/520
(58) Field of Classification Search .......... 375/238, 375/239, 354, 362, 364; 370/213, 503, 520; 329/312, 313; 332/109, 112
See application file for complete search history.

(56) References Cited

U.S. PATENT DOCUMENTS

| | | | |
|---|---|---|---|
| 4,154,985 A | 5/1979 | Munter | 179/15 BV |
| 4,374,437 A * | 2/1983 | Citta et al. | 455/164.2 |
| 5,034,962 A * | 7/1991 | Yamamoto et al. | 375/222 |
| 5,760,617 A | 6/1998 | Coln et al. | 327/101 |
| 5,930,294 A * | 7/1999 | Chapman | 375/213 |
| 2003/0173945 A1* | 9/2003 | Grushin | 324/76.55 |

FOREIGN PATENT DOCUMENTS

| | | |
|---|---|---|
| DE | 2551685 | 11/1975 |
| EP | 0068535 | 6/1982 |

OTHER PUBLICATIONS

International Search Report and Written Opinion; PCT/US2005/041684; pp. 10.

* cited by examiner

*Primary Examiner*—Young T. Tse
(74) *Attorney, Agent, or Firm*—Baker Botts L.L.P.

(57) ABSTRACT

A microcontroller having digital to frequency converter and pulse frequency modulator capabilities. The digital to frequency converter (DFC) generates a 50 percent duty cycle square wave signal that may be varied in frequency, wherein the 50 percent duty cycle square wave signal is directly proportional and linear with a count value put into an increment register. The pulse to frequency modulator (PFM) generates pulses having pulse widths of the input clock for each rollover of a counter. The frequency of these pulses is directly proportional and linear with the count value put into the increment register.

8 Claims, 2 Drawing Sheets

MICROCONTROLLER HAVING A DIGITAL TO FREQUENCY CONVERTER AND/OR A PULSE FREQUENCY MODULATOR

TECHNICAL FIELD OF THE INVENTION

The present invention relates to integrated circuit microcontrollers, more particularly, to an integrated circuit microcontroller having digital to frequency converter and pulse frequency modulator capabilities.

BACKGROUND OF THE RELATED TECHNOLOGY

An integrated circuit microcontroller uses a clock(s) to drive or step operation of sequential and latching digital circuits, and information transfer over data buses. Timers, counters, prescalers, and storage registers may also be incorporated into the integrated circuit microcontroller and may use the clock(s) for operation thereof. The counters count up or down by one count for each clock pulse and are used for the timers, prescalers, etc. Microcontrollers are finding widespread use in power generation and control, electronic lighting ballasts, motor control and radio tuning. Therefore, there is a need for integrated circuit microcontrollers to have a digital to frequency converter (DFC) output, and/or a pulse frequency modulator (PFM) output.

SUMMARY OF THE INVENTION

The present invention overcomes the above-identified problems as well as other shortcomings and deficiencies of existing technologies by providing an integrated circuit microcontroller having digital to frequency converter and/or pulse frequency modulator capabilities. The digital to frequency converter (DFC) may generate a 50 percent duty cycle square wave signal that may be varied in frequency, wherein the 50 percent duty cycle square wave signal is directly proportional and linear with a count value put into an increment register. The pulse to frequency modulator (PFM) may generate pulses having pulse widths of a input clock for each rollover of a counter. The frequency of these pulses is directly proportional and linear with the count value put into an increment register.

Since the DFC may be operated at a high frequency (up to ½ the clock frequency) and the length of the PFM pulse is very short (input clock pulse width), inductive components of an electronic system using the microcontroller with DFC and/or PFM capabilities may be substantially smaller since an output filter may be designed for use at a higher frequency. The logic circuits used for generating the DFC and/or PFM signals may also be utilized for a standard timer/counter. Thus the present invention microcontroller is capable of DFC and PFM generation, and standard timing and counting.

According to a specific exemplary embodiment of the present invention, the DFC and/or PFM of the integrated circuit microcontroller may comprise an internal oscillator (e.g., crystal oscillator, RC oscillator, LC oscillator, etc.) and/or provision for an external oscillator, gating logic, frequency prescaler, synchronizer, a timer/counter, a full-adder, an increment register, a slave register, and a dead band generator. The slave register may be used to insure glitch-free operation of the digital device with the increment register.

Contrary to the operation of a standard timer module which only can count up by one for each clock pulse, a specific exemplary embodiment of the present invention may add the value in the increment register to the value in the timer/counter and then return the resultant sum to the timer/counter as a new value therein. This provides for a "count by N" capability. This further allows using the high-order bit (e.g., bit 7 for an 8 bit counter, bit 15 for a 16 bit counter, bit 31 for a 32 bit counter, etc.) to provide a 50 percent duty cycle output. This output is directly proportional and linear with the value loaded into the increment register when being used for a DFC output. A carry-out bit of the full-adder may be used as an output for providing a fixed pulse period that may be varied in frequency, thus providing the PFM output.

The specific exemplary embodiment of the invention may also have complementary outputs. The dead band generator may have a dead band register that may contain the number of clock pulses desired for the dead band, e.g., an 8 bit dead band register may be used to select between 0 to 255 clock counts of dead band.

A technical advantage of the present invention is a DFC output that may be varied in frequency up to one half the clock input.

Another technical advantage is the DFC output is directly proportional and linear with the value loaded into an increment register.

Another technical advantage is the DFC output is at a 50 percent duty cycle.

Another technical advantage is a slave register may be used to insure glitch-free operation of the increment register.

Another technical advantage is a timer/counter having count by N capabilities.

Another technical advantage is a PFM output that may be varied in frequency up to one half the clock input and has a pulse width of the input clock.

Another technical advantage is the PFM output is directly proportional and linear with the value loaded into an increment register.

Another technical advantage is generation of DFC and PFM signals, and standard timing and counting using the same logic module.

Other technical features and advantages will be apparent from the following description of the embodiments, given for the purpose of disclosure and taken in conjunction with the accompanying drawings.

BRIEF DESCRIPTION OF THE DRAWINGS

A more complete understanding of the present disclosure and advantages thereof may be acquired by referring to the following description taken in conjunction with the accompanying drawings wherein.

Figure 1:
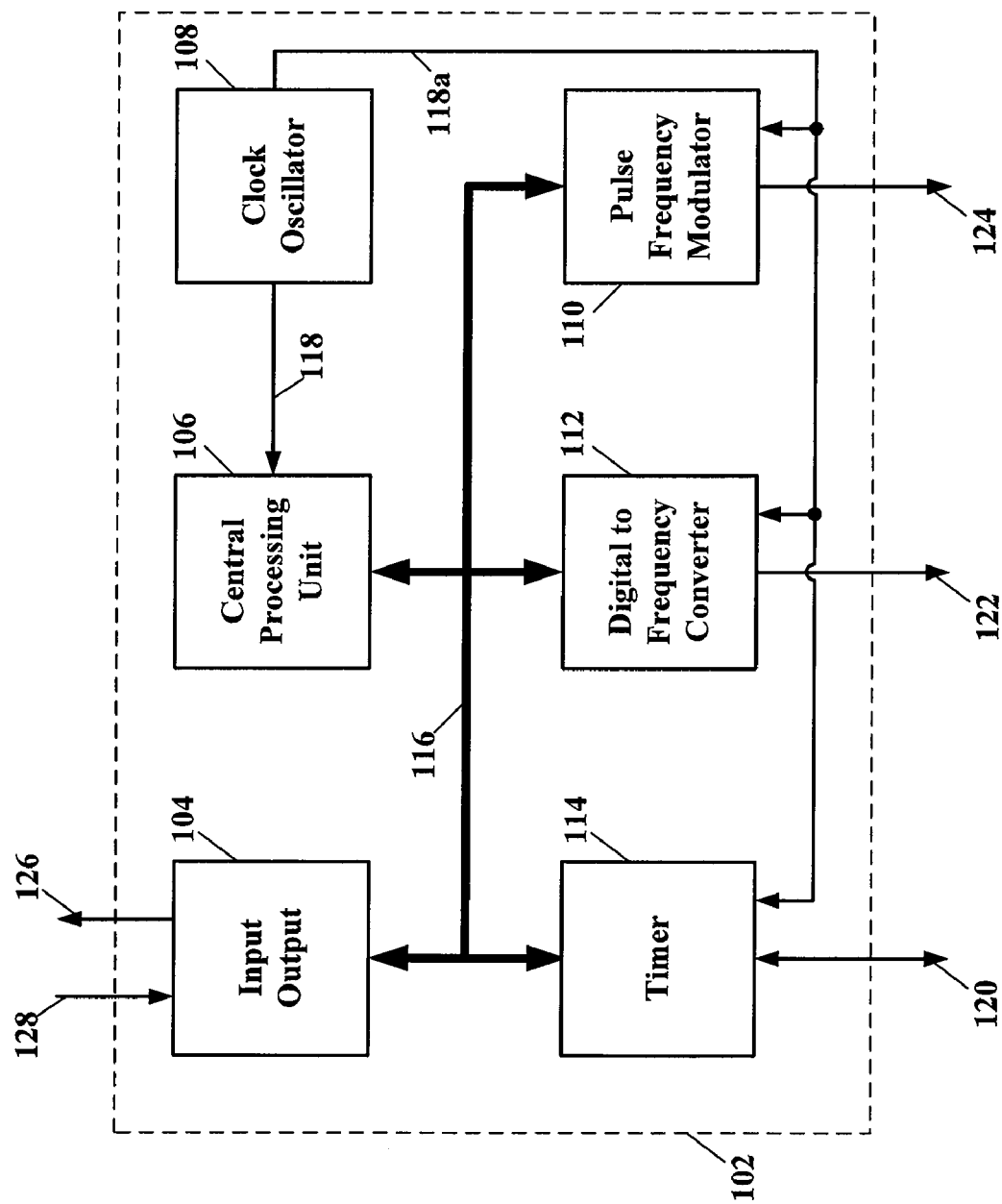
FIG. 1 is a schematic block diagram of an integrated circuit microcontroller having digital to frequency converter (DFC) and/or pulse to frequency modulator (PFM) capabilities.

While the present invention is susceptible to various modifications and alternative forms, specific exemplary embodiments thereof have been shown by way of example in the drawing and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Referring now to the drawings, the details of exemplary embodiments of the present invention are schematically illustrated. Like elements in the drawings will be represented by like numbers, and similar elements will be represented by like numbers with a different lower case letter suffix.

Clock speed as used herein refers to the frequency of an oscillator used to generate the clock, the higher the frequency the faster the clock speed.

Referring to FIG. 1, depicted is a schematic block diagram of an integrated circuit microcontroller having digital to frequency converter (DFC) and/or pulse to frequency modulator (PFM) capabilities. The integrated circuit microcontroller 102 may comprise input/output interfaces 104, a central processing unit (CPU) 106, a clock oscillator 108, a timer 114, a digital to frequency converter 112, and a pulse frequency modulator 110. The CPU 106 may transfer data and control information to the timer 114, digital to frequency converter 112, and pulse frequency modulator 110 over data and control bus 116. Clock signals may be coupled from the clock oscillator 108 over clock signal lines 118 and 118a to the CPU 106, timer 114, digital to frequency converter 112, and pulse frequency modulator 110.

Figure 2:
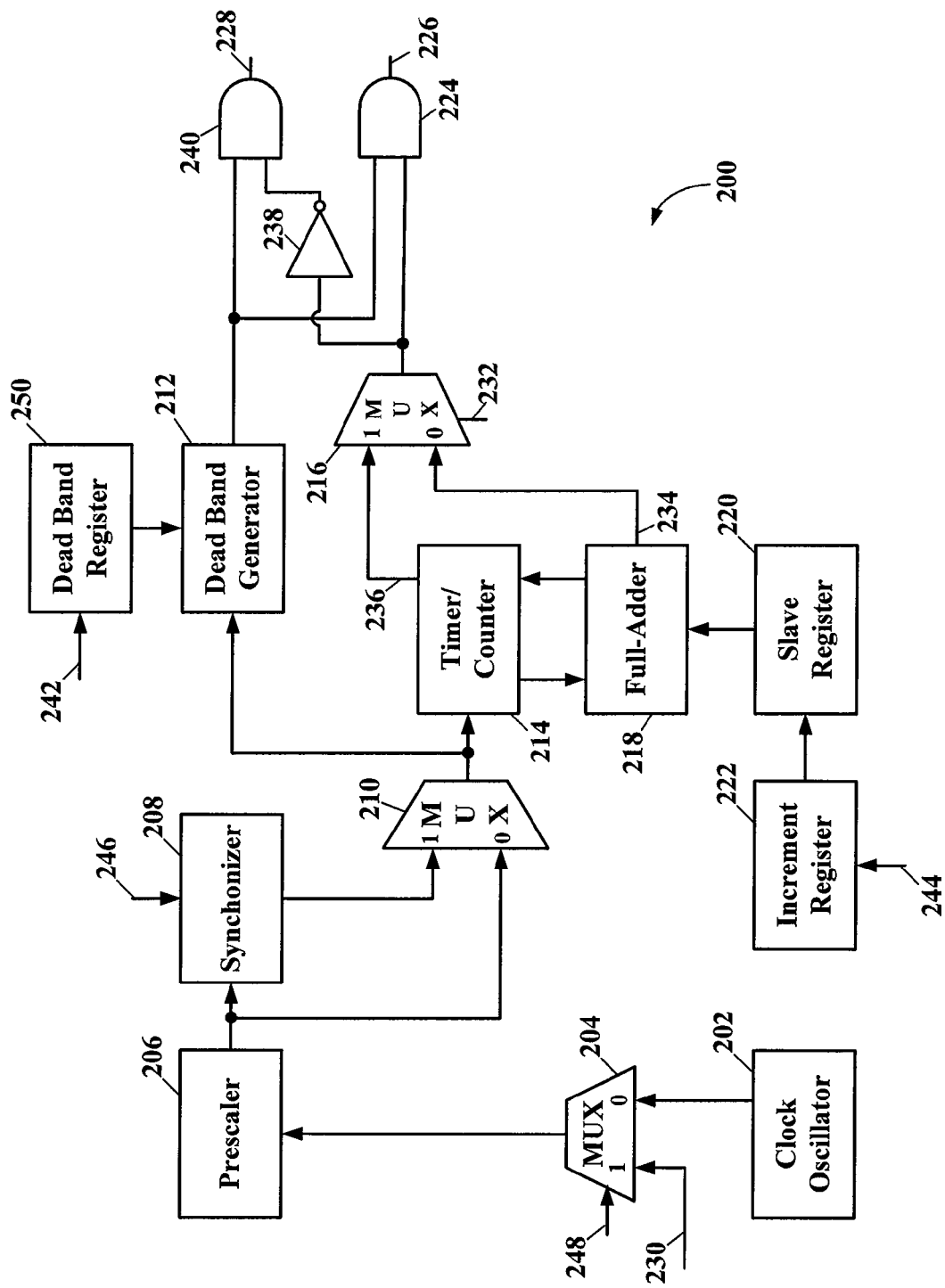
FIG. 2 is a schematic block diagram of digital logic for generating DFC and/or PFM, according to a specific exemplary embodiment.

Referring to FIG. 2, depicted is a schematic block diagram of digital logic for generating DFC and/or PFM, according to a specific exemplary embodiment. The DFC and PFM logic, generally represented by the numeral 200, may comprise an internal clock oscillator 202 (the internal clock oscillator 202 may be separate from or may be the clock oscillator 108 of the microcontroller 102), a clock multiplexer 204, a frequency prescaler 206, a synchronizer 208, a synchronized/non-synchronized clock multiplexer 210, a dead band generator 212, a timer/counter 214, a DFC/PFM multiplexer 216, a full-adder 218, a slave register 220, an increment register 222 and an AND gate 224. The output 226 of the AND gate 224 is adapted to supply either a DFC (50 percent duty cycle) or PFM (pulse at the pulse width of the clock) signal. Optionally, an AND gate 240 (from inverter 238) may have an output 228 adapted to supply the complement of either the DFC or PFM signal of the output 226. Either an external clock input 230 or the internal oscillator 202 may be selected by the clock multiplexer 204 with an input 248 from, for example, the CPU 106 over the bus 116.

The clock multiplexer 204 has one input coupled to the internal oscillator 202 and another input 230 adapted for coupling to an external oscillator (not shown). Selection may be controlled by the input 248 from, for example, the CPU 106 over the bus 116. The output of the clock multiplexer 204 is coupled to the prescaler 206 which can divide the selected oscillator frequency, e.g., by a positive integer value. The output of the prescaler 206 is coupled to an input of the synchronizer 208 and one input of the synchronized/non-synchronized clock multiplexer 210. The other input of the synchronized/non-synchronized clock multiplexer 210 is coupled to the output of the synchronizer 208. The synchronizer 208 may be used to synchronize assertion of clock pulses, e.g., upon the occurrence of a wake-up event, e.g., at input 246. Selection of either synchronized or non-synchronized (prescaled) clock pulses is performed with the synchronized/non-synchronized clock multiplexer 210 and is coupled to the timer/counter 214 and dead band generator 212.

The slave register 220 stores an increment value found in the increment register 222. The increment value may be loaded into the increment register 222 through input 244. The count value stored in the timer/counter 214 and increment value stored in the slave register 220 are added together in the full-adder 218 and the result is stored back into the timer/counter 214 at each clock pulse (from the output of the synchronized/non-synchronized clock multiplexer 210). This allows for a "count by N" counter wherein the high-order bit, e.g., bit 7 for an 8 bit counter, bit 15 for a 16 bit counter, bit 31 for a 32 bit counter, etc., at output 236 may be used to provide a 50 percent duty cycle output for the DFC mode. When the high-order bit is at a logic high the output is at a logic high, and when high-order bit is at a logic low the output is at a logic low. In the PFM mode, when the timer/counter 214 rolls over, the carry-out output 234 from the full-adder 218 may be used to generate the fixed pulse period, variable frequency output. The DFC/PFM multiplexer 216 selects either the output 236 (DFC—50 percent duty cycle) or the 234 output (PFM—pulse at the pulse width of the clock) with the DFC/PFM select input 232.

The outputs of the dead band generator 212 and the DFC/PFM multiplexer 216 may be combined in the AND gate 224, inverter 238 and AND gate 240 for introducing a selectable dead band between the normally opposite logic level outputs 226 and 228. The dead band generator may have a dead band register (not shown) that may contain the number of clock pulses desired for the dead band, e.g., an 8 bit dead band register may be used to select between 0 to 255 clock counts of dead band between the outputs 226 and 228. The dead band register may be loaded through an input 242 from, for example, the CPU 106 over the bus 116.

The invention, therefore, is well adapted to carry out the objects and attain the ends and advantages mentioned, as well as others inherent therein. While the invention has been depicted, described, and is defined by reference to exemplary embodiments of the invention, such references do not imply a limitation on the invention, and no such limitation is to be inferred. The invention is capable of considerable modification, alternation, and equivalents in form and function, as will occur to those ordinarily skilled in the pertinent arts and having the benefit of this disclosure. The depicted and described embodiments of the invention are exemplary only, and are not exhaustive of the scope of the invention. Consequently, the invention is intended to be limited only by the spirit and scope of the appended claims, giving full cognizance to equivalents in all respects.

What is claimed is:

1. A method for digital-to-frequency conversion and pulse frequency modulation with an integrated circuit microcontroller having a timer/counter and an increment register, said method comprising the steps of:
   providing a count-value in the timer/counter;
   providing an N-value in the increment register;
   adding the count-value and the N-value, then storing the result in the timer/counter at each one of a plurality of clock pulses;
   selecting a high-order bit of the timer/counter for the digital-to-frequency conversion; and
   selecting a carry-out resulting from the step of adding for the pulse frequency modulation.

2. The method according to claim 1, further comprising the step of storing the N-value in a slave register.

3. The method according to claim 1, further comprising the step of inverting the digital-to-frequency conversion and the pulse frequency modulation.

4. The method according to claim 3, further comprising the step of generating a dead band between the digital-to-fre quency conversion and the inverted digital-to-frequency conversion.

5. The method according to claim 3, further comprising the step of generating a dead band between the pulse frequency modulation and the inverted pulse frequency modulation.

6. The method according to claim 1, further comprising the step of synchronizing the plurality of clock pulses to an event.

7. The method according to claim 1, further comprising the step of pre-scaling the frequency of the plurality of clock pulses.

8. The method according to claim 1, further comprising the step of writing data to the increment register with a central processing unit of the microcontroller.

\* \* \* \* \*